US007197429B2

(12) United States Patent  
Rosa

(10) Patent No.: US 7,197,429 B2
(45) Date of Patent: Mar. 27, 2007

(54) DIAGNOSIS SYSTEM FOR HOUSEHOLD ELECTRIC APPLIANCES

(75) Inventor: Fabio Eduardo Rosa, Joinville-SC (BR)

(73) Assignee: Multibras S.A. Eletrodomesticos, Sao Paulo-SP (BR)

(*) Notice: Subject to any disclaimer, the term of this patent is extended or adjusted under 35 U.S.C. 154(b) by 0 days.

(21) Appl. No.: 10/537,585

(22) PCT Filed: Dec. 2, 2003

(86) PCT No.: PCT/BR03/00185

§ 371 (c)(1),
(2), (4) Date: Jul. 15, 2005

(87) PCT Pub. No.: WO2004/051293

PCT Pub. Date: Jun. 17, 2004

(65) Prior Publication Data

US 2006/0106576 A1    May 18, 2006

(30) Foreign Application Priority Data

Dec. 5, 2002   (BR) .................................... 0205470

(51) Int. Cl.
   *G01R 31/00* (2006.01)
(52) U.S. Cl. .................... 702/183; 702/58; 702/59; 702/64; 307/38; 307/85
(58) Field of Classification Search ............... 702/183, 702/57–59, 60, 64, 65, 108, 117, 118, 120, 702/124, 126, 182, 185, 188, 189, 198
   See application file for complete search history.

(56) References Cited

U.S. PATENT DOCUMENTS

| 4,977,394 | A | * | 12/1990 | Manson et al. ............. 340/679 |
| 5,256,905 | A | * | 10/1993 | Striek et al. .................. 307/34 |
| 5,896,086 | A | * | 4/1999 | Ida .............................. 340/524 |
| 6,356,853 | B1 | | 3/2002 | Sulliavan |
| 2005/0248215 | A1 | * | 11/2005 | Rosa et al. ................... 307/38 |

FOREIGN PATENT DOCUMENTS

| DE | 36 16 506 A1 | 11/1987 |
| DE | 100 19 612 A1 | 10/2001 |
| EP | 0 059 774 B1 | 9/1982 |
| WO | WO2004017482 A2 * | 2/2004 |

* cited by examiner

Primary Examiner—Hal Wachsman
(74) Attorney, Agent, or Firm—Darby & Darby

(57) ABSTRACT

A diagnosis system for household electric appliances, such as refrigerators, freezers, and others, presenting multiple loads, energized by switches commanded by electronic controls coupled to a command module, which energizes the loads and an interface. The system includes a voltmeter to measure a first voltage in the inlet of the loads with the switches opened and a second voltage in the inlet of each load with respective switch closed, and a control unit for processing the values of the first voltage and of each second voltage. The control unit provides an interface with an indication of a failure in the command module, in the switches, or in the respective electronic controls thereof, in case a second voltage presents a value that is equal to or higher than that of the first voltage.

19 Claims, 9 Drawing Sheets

DIAGNOSIS SYSTEM FOR HOUSEHOLD ELECTRIC APPLIANCES

CROSS-REFERENCE TO RELATED APPLICATIONS

This is a U.S. national phase application under 35 U.S.C. §371 of International Patent Application No. PCT/BR2003/000185, filed Dec. 2, 2003, and claims benefit of Brazilian Patent Application No. PI 0205470-1, filed Dec. 5, 2002 both of which are incorporated by reference herein. The International Application was published in English on Jun. 17, 2004 as WO 2004/051293 A1 under PCT Article 21(2).

FIELD OF THE INVENTION

The present invention refers to a diagnosis system for identifying the origin of failures in the operation of household electric appliances, such as refrigerators, freezers, air conditioners, and others, in which the operation of their different loads is defined by a command module mounted to the refrigeration appliance. The invention is particularly related to a diagnosis system incorporated to the household electric appliance and operatively associated with the command module.

PRIOR ART

In household electric appliances, particularly in the refrigeration appliances defined by refrigerators and freezers, in which there are provided different devices or loads, such as defrost resistances, fans, lamps, and compressor, the operation thereof is controlled by an electronic command module which is programmed to activate and deactivate the switches (generally relays) that energize the different loads of the appliance as a function of the desired operational conditions. In these appliances, the command module and the different electronic controls are energized by a generally DC power source, which in turn is energized by the power system that energizes the appliance.

The quick and reliable identification of the different failures in the operation of the above-mentioned appliances already installed in the residences of the users has been a constant preoccupation of the manufacturers.

When a failure in the operation of the appliance is noticed by the user and informed to the authorized technical assistance, it is the responsibility of the latter to identify the problem and solve it by repairing or replacing the damaged component. The deficiencies, whether caused by the operator or by the equipments and which usually appear during a diagnosis phase in which the prompt and reliable identification of the failure should be obtained, cause considerable losses to the manufacturer and to the users, as a function of improper replacements of the command module or of the different loads of the circuit of appliance, such as defrost resistances, fans, lamps, and compressor.

One of the systems presently used to reduce the time spent in the diagnosis and the errors made by the technicians comprises a diagnosis device developed to simulate the loads of each appliance model and which should be carried by the technician in charge, who will couple it to the command module of the appliance. The diagnosis device is then operated by the technician, according to a predetermined sequence of procedures to be followed, in such a way as to simulate the operational conditions of the involved loads and to check the conditions of the means that form the command module.

This known system type allows the technician in charge of the diagnosis to instruct the diagnosis device to execute each checking step, according to the predetermined sequence, and to observe visually the indications, generally luminous signs displayed in the diagnosis device and which represent the operational condition tested for each of the components (switches, etc.) of the command module, verifying whether a failure occurred in one of the components and the real need for replacing it.

Nevertheless, this type of diagnosis system requires a skilled and careful operator to provide a reliable diagnosis, in order to avoid an undesirably high rate of diagnosis errors.

Another deficiency of the system mentioned above is due to the fact that it only indicates the operational conditions of the command module, requiring other test procedures to check the operational conditions of the different loads of the electric circuit of the appliance.

A further disadvantage of the solution that utilizes the diagnosis device is that the technician in charge needs to carry specific diagnosis devices for different appliance models. With an undesirable high frequency, the checking of the damaged appliance is effected without the adequate diagnosis device, leading to unnecessary orders to replace the command module.

There are also known sophisticated solutions of self-diagnosis, which precisely indicate the defective component, such as those provided in some appliances, equipments, and devices. However, these solutions of directly detecting the voltage values are relatively expensive, increasing the final cost of the appliance.

OBJECTS OF THE INVENTION

By reason of the deficiencies known heretofore, as discussed above, it is the generic object of the present invention to provide a diagnosis system to be incorporated into an electric household appliance, such as a refrigerator, freezer, or air conditioner, in order to allow for a prompt, simple, and reliable identification of the operational failures, not only in the command module, but also in the loads energized thereby, without requiring the technician in charge to carry a special device to be coupled to the command module, or to base his conclusion on the interpretation of different test parameters to be observed and considered.

It is a further object of the invention to propose a diagnosis system incorporated to the appliance, such as mentioned above, which presents a simple construction of relatively low cost.

SUMMARY OF THE INVENTION

The present diagnosis system is directed to refrigeration appliances, such as refrigerators, freezers, and air conditioners provided with loads, such as compressors, defrost resistances, lamps, etc., which are energized by switches commanded by respective electronic controls operatively coupled to a command module, which energizes the switches and an interface coupled thereto.

According to a first aspect of the invention, the diagnosis system comprises: a voltmeter operatively coupled to an inlet of each one of the loads, so as to measure a first voltage in the inlet of the loads with the switches opened, and a second voltage in the inlet of each load having its respective switch closed; and a control unit operatively associated with the command module and with the voltmeter and to be operated according to a sequence of tests that are selectively activated to receive from the voltmeter the values of the first voltage and of each second voltage and to process these values, indicating in an interface the existence of failure in at least one of the elements defined by the command module, by the switches and their respective electronic controls, in case any second voltage presents a value which is equal or to higher than that of the first voltage. In this case, the control unit can, optionally, interrupt the sequence of tests.

BRIEF DESCRIPTION OF THE DRAWINGS

The invention will be described now, with reference to the enclosed drawings directed to a possible way of carrying out the invention, and in which.

DETAILED DESCRIPTION OF THE INVENTION

Figure 1:
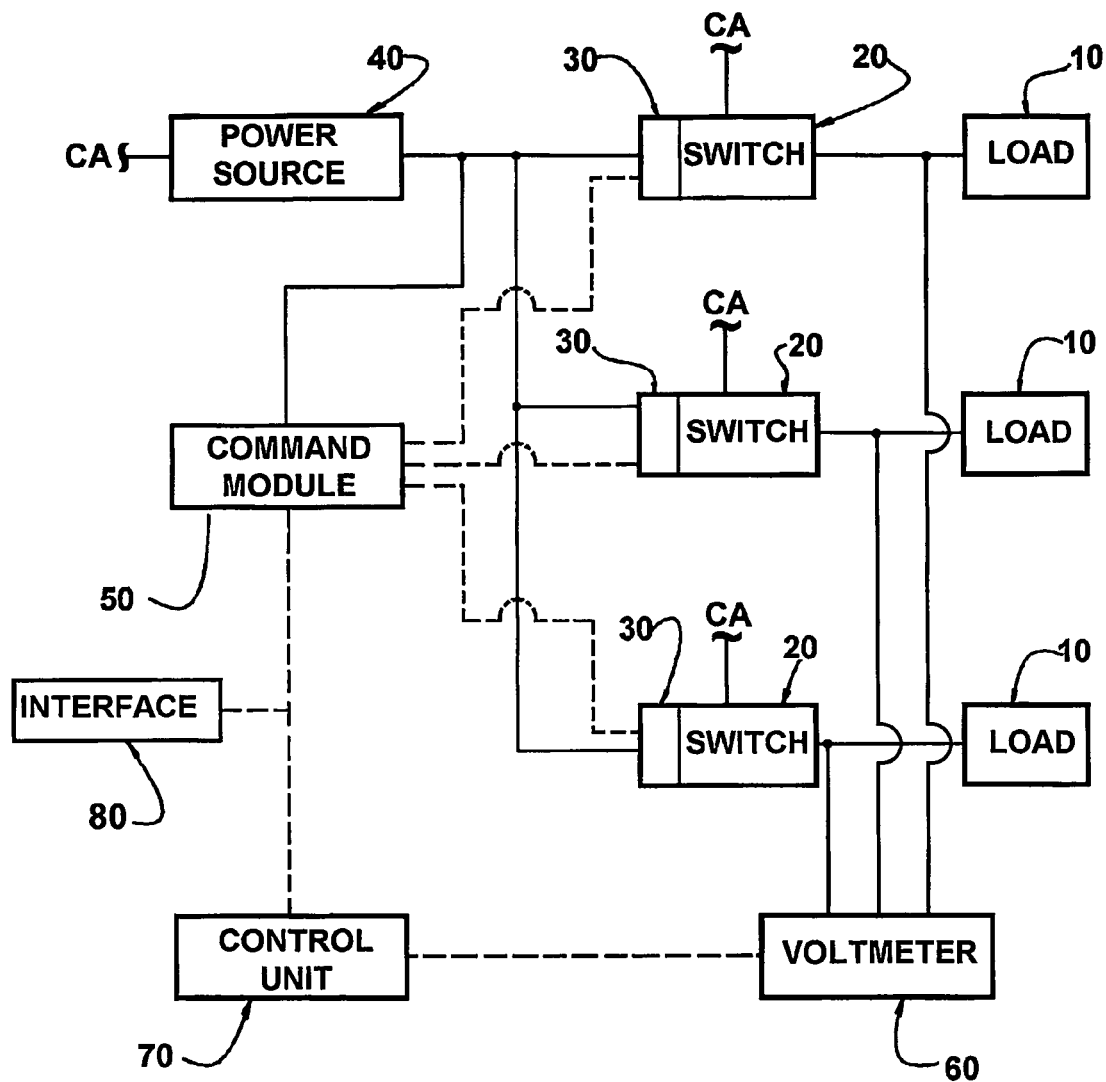
FIG. 1 is a simplified scheme of the operative association between a command module, the loads of a refrigerator or freezer, and the present diagnosis system provided with a control unit.

As illustrated in the drawings and as mentioned above, the present diagnosis system is applied to electric household appliances, such as freezers, etc., presenting different loads 10, which can take the form of, for example, a compressor, lamps, a defrost electric resistance, etc., and whose activation, energized by an AC power system, is effected by respective switches 20 operated by respective electronic controls 30 operatively associated thereto, as a function of the operational requirements of the refrigeration appliance.

The electronic controls are disposed in parallel and generally DC energized by a power source 40 connected to the AC power system.

The electronic controls 30 are operatively coupled and generally physically mounted to a command module 50, which is energized by the power source 40 and constructed so as to command the activation of the different loads 10 by energizing the electronic controls 30 of the respective switches 20. The command module 50 can present any known construction usually utilized to command the automatic activation of the different loads 10 of an appliance, as a function of the operational parameters selected by the user and defined during project.

In the illustrated embodiment described below, the loads 10 are defined by the compressor, by the defrost resistance and by the internal light (lamp) of the cabinet of a refrigeration appliance. The fans, if present in the refrigeration appliances of the forced ventilation (no frost) type can have their operational conditions also diagnosed by the same procedures considered herein, and the fans can be operationally included in the definition of the loads whose correct operation is desired to be checked through the present diagnosis system.

According to a first aspect of the invention, the present diagnosis system comprises a voltmeter 60, energized by a power source 40 and operatively connected to the inlet of each of the loads 10, in order to measure the voltage supplied to the different loads in different operational conditions of the electronic switches 20 automatically determined by a control unit 70, according to a predetermined operational sequence of tests, as described ahead.

The control unit 70 is operatively associated with both the command module 50 and the voltmeter 60 to define the operational sequence of closing and opening the switches 20 in the diagnosis procedure, and to record and process the voltage values informed by the voltmeter in the different operational conditions of the switches 20.

Figure 2:
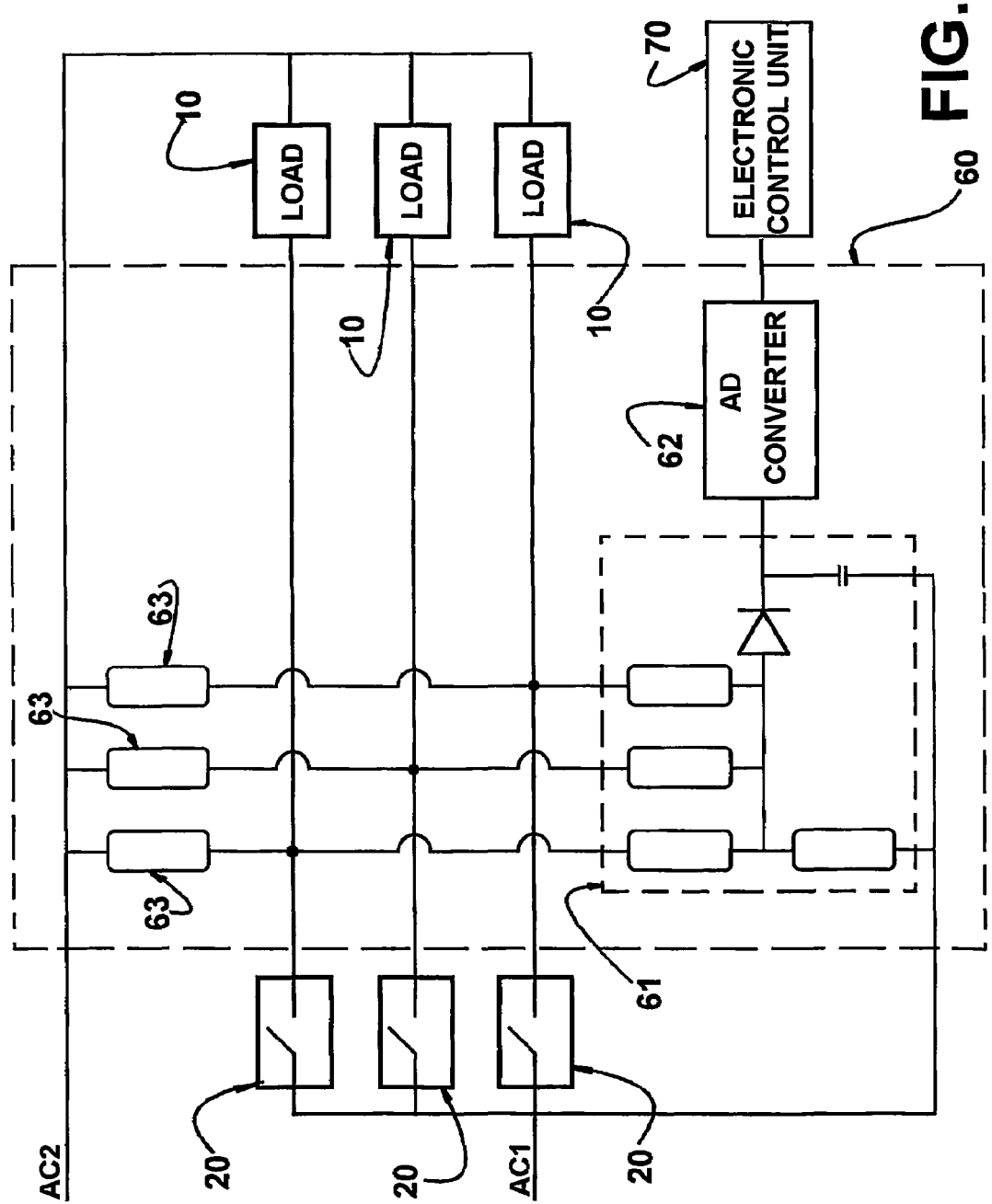
FIG. 2 is a simplified scheme of the voltmeter operatively associated with the control unit and with the loads of the refrigeration appliance.

As illustrated in FIG. 2, the voltmeter 60 comprises a signal conditioning circuit 61, connected to the inlet of each load 10 upstream the respective switch 20 and supplying voltage signals from the inlet of the load 10 to an AD converter 62 connected to the control unit 70.

The signal conditioning circuit 61 is formed, in the illustrated example, by a resistive divider with "n" inlets corresponding to the quantity of loads to be diagnosed (in the present case, for example, three inlets), by a signal rectifying diode and a signal filtering capacitor, in order to adjust the inlet AC voltage to the levels required by the AD converter 62.

The signal conditioning circuit further comprises an assembly of resistors 63 respectively connected in parallel with the loads 70 for providing the adequate maintenance of a predetermined voltage in the circuit supplying the loads 10 upon opening thereof.

The voltage signals obtained from the inlet of the loads 10 are conditioned by the conditioning circuit and sent to the AD converter 62 and thence to the control unit 70.

The electronic control unit 10 and the command module 50 are operatively associated with an interface 80 that can take different forms, such as a connector for the acquisition or transfer of signals, a visual or sonorous alarm, or a display also mounted to the structure of the cabinet of the refrigeration appliance in a visible place and which can be further provided with activating means, such as keys, buttons, etc. (not illustrated), which allow the user to interact with the appliance, altering some operational parameters.

The voltage values detected by the voltmeter 60 are processed by the control unit 70 according to an automatic operational sequence that is activated by the technician in charge of executing the diagnosis.

To initiate the diagnosis procedure, the technician de-energizes the refrigeration appliance and reconnects it subsequently, in order to activate, within a subsequent short period of time, generally not higher than 1 minute, the electronic control unit 70, with a predetermined password exclusively used by the technical assistance, giving start to an operational sequence of tests to be automatically performed by the control unit 70 with the aid of both the voltmeter 60 and the command module 50.

Figure 5:
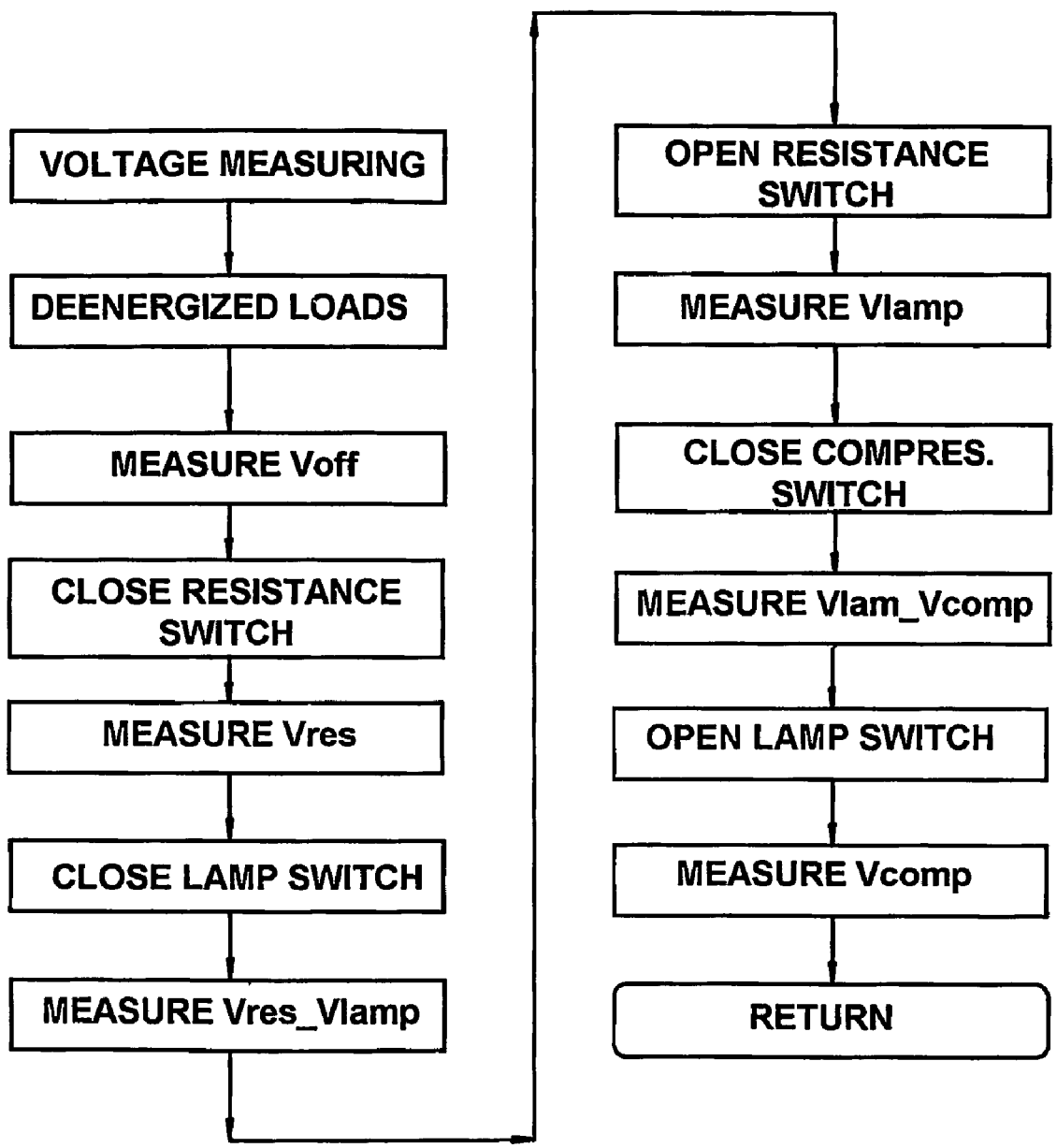
FIG. 5 is a block diagram similar to that of FIG. 4, but illustrating a possible variation for the operational sequence in the step of acquiring the voltage values.

The electronic control unit 70 starts an operational phase of acquiring voltage values by means of the voltmeter 60. This phase of acquiring voltage values has the purpose of measuring, by means of the voltmeter 60, and recording, in the control unit 70, the voltage value Voff that supplies all the loads 10 in the de-energized (off) condition by opening the respective switches 20, and also the voltage values Vres, Vlamp, Vcomp that supply each of the loads 10 in the energized (on) condition by closing a respective switch 20, according to a predetermined sequence. Also in this phase of acquiring voltage values there can be further optionally obtained through the voltmeter 60 and recorded in the control unit 70 the supply voltage of each two or three loads 10 together, which can be simultaneously energized by closing the respective switches 20, as illustrated in FIG. 5.

Figure 4:
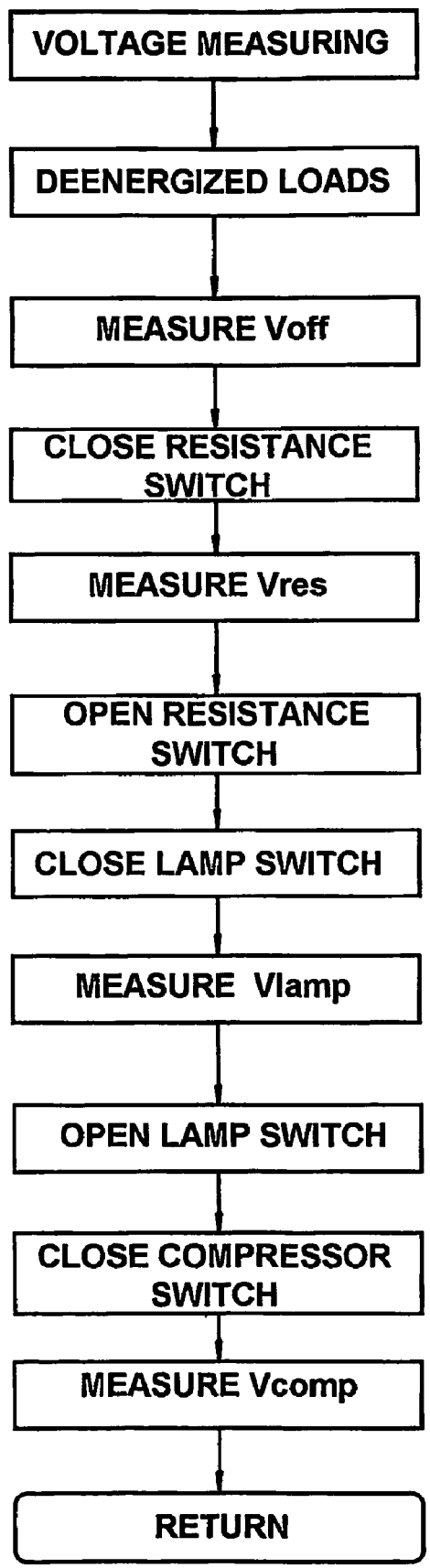
FIG. 4 is a block diagram of the operational sequence defined by the control unit in the step of acquiring the voltage values.

In the exemplary operational sequence of tests illustrated in FIG. 4, the acquisition of the voltage values follows the steps below:

opening all the switches 20;

awaiting a certain minimum time to elapse, for example about 5 seconds, and measuring and recording a first voltage Voff corresponding to the voltage value in the inlet of all the loads 10, with the switches 20 opened;

closing the switch 20 of the defrost resistance;

awaiting the certain minimum time to elapse and measuring and recording the voltage value Vres in the inlet of the defrost resistance;

opening the switch 20 of the defrost resistance;

closing the switch 20 of the lamp;

awaiting the certain minimum time to elapse and measuring and recording the voltage value Vlamp in the inlet of the lamp, whose switch 20 is closed;

opening the switch 20 of the lamp;

closing the switch 20 of the compressor;

awaiting the certain minimum time to elapse and measuring and recording a second voltage value Vcomp in the inlet of the compressor, whose switch 20 is closed; and maintaining the switch of the compressor closed.

In case one desires to obtain voltage values in the inlet of each two or three loads 10 together, with their respective switches 20 being simultaneously closed, it is only necessary, before opening a switch 20 after acquiring the second voltage Vres, Vlamp, Vcomp of the respective load 10, to close another switch 20 and to measure and record the voltage value in the inlet of the two or three loads 10, whose switches are found simultaneously closed. It should be noted that the loads 10 to be associated for the joint measure of the voltage are those which can be simultaneously energized in the household electric appliance.

In the exemplary operational sequence of tests illustrated in FIG. 5, the acquisition of the voltage values follows the steps below:

opening all the switches 20;

awaiting a certain minimum time to elapse, for example about 5 seconds, and measuring and recording a first voltage Voff corresponding to the voltage value in the inlet of all the loads 10, with the switches 20 opened;

closing the switch 20 of the defrost resistance;

awaiting the certain minimum time and measuring and recording the voltage value in the inlet of the defrost resistance;

closing the switch 20 of the lamp;

awaiting the certain minimum time and measuring and recording the voltage value Vres_Vlamp in the inlet of the defrost resistance and of the lamp;

opening the switch 20 of the defrost resistance;

awaiting the certain minimum time and measuring and recording a second voltage value Vlamp in the inlet of the lamp;

closing the switch 20 of the compressor;

awaiting the certain minimum time and measuring and recording the voltage value Vres_Vcomp in the inlet of the lamp and of the compressor;

opening the switch 20 of the lamp;

waiting for the certain minimum time and measuring and recording the voltage value Vcomp in the inlet of the compressor;

maintaining the switch 20 of the compressor closed.

Figure 6:
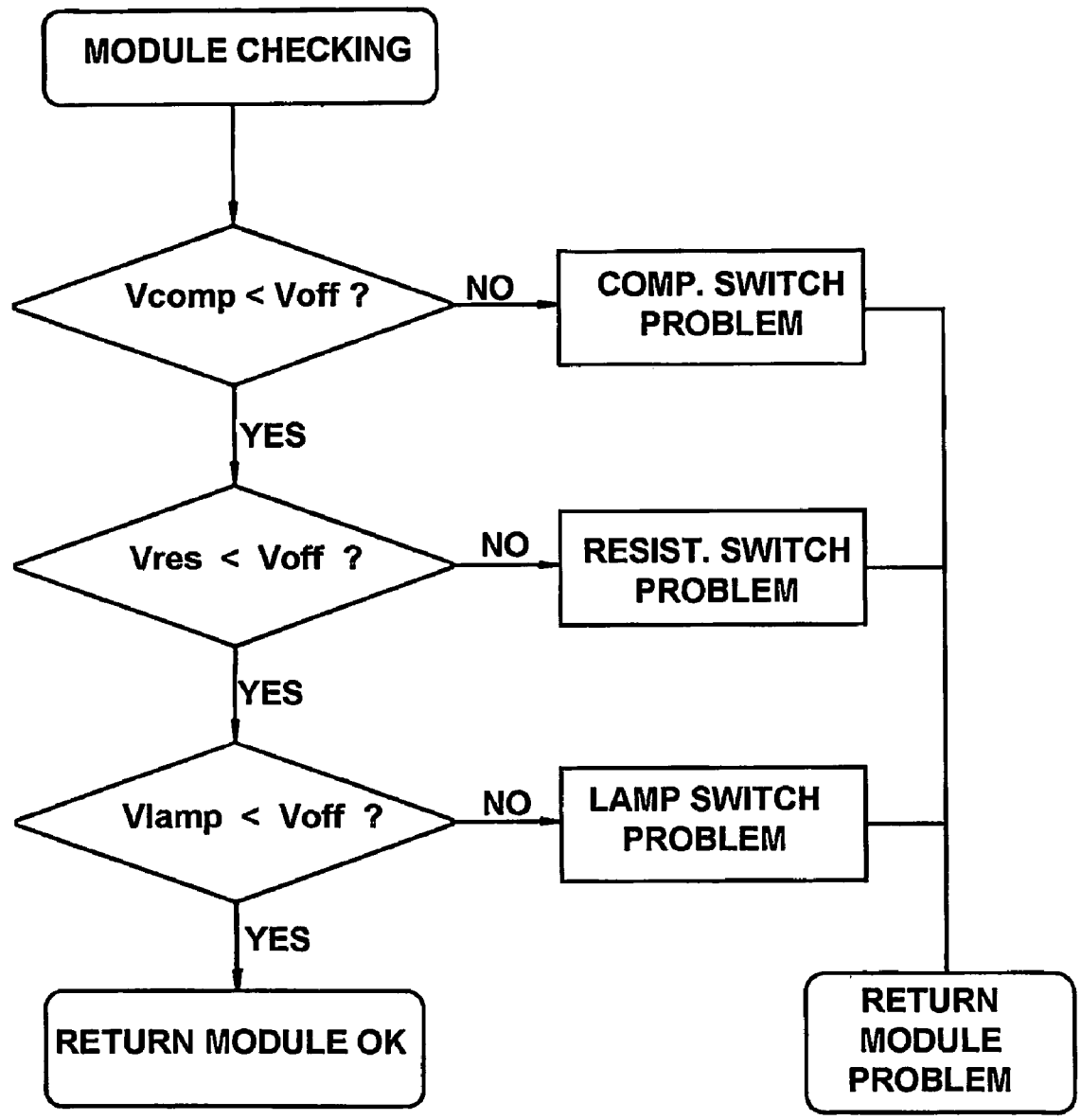
FIG. 6 is a block diagram of a processing operational sequence of the control unit in the step of checking the operational conditions of the command module.

Once the voltage values in the inlet of the loads 10 have been recorded in the conditions in which the respective switches 20 are opened, closed, and optionally closed in different groups, the control unit 70 initiates a second processing phase, diagrammatically illustrated in FIG. 6 and which has the purpose of checking the operational conditions of the switches 20, of the electronic controls 30, and consequently of the plate of the command module 50 which also carries the electronic controls 30 and the switches 20.

According to FIG. 6, the phase of checking the plate of the command module 50 comprises the steps of comparing, sequentially, the first voltage Voff in the inlet of each of the loads 10 presenting the respective switches 20 in the open condition with the second voltages Vres, Vlamp, Vcomp in the inlet of the loads 10 presenting the respective switches 20 in the closed condition, and indicating, in the interface 80, whether the first voltage Voff is higher than the second voltage Vres, Vlamp, Vcomp in the inlet of the respective load 10 with the switch closed. In case this condition occurs in all the loads 10, the processing system concludes that all respective switches 20 and the electronic controls 30 of the command module 50 are in good conditions, since no failures have been detected in the switches 20 or in their associated electronic controls 30.

In case in any of the steps of comparing the first Voff voltage with the second voltages Vres, Vlamp, Vcomp of the loads 10 a different condition is detected in the relation of expected values, i.e., any second voltage with a value equal to or higher than that of the first voltage, the control unit 70 indicates the anomaly at the interface 80, informing the existence of a failure in one of the components of the plate of the command module 50, leading to the replacement of the component. In this case, the diagnosis procedure is ended, since it is not safe to continue the tests of the loads 10 with the deficient command module 50. In the hypothesis the first voltage Voff is lower than the second voltages Vres, Vlamp, Vcomp, the control unit 70 will produce in the interface 80 the indications that the problem is neither located in the command module 50 nor in its components defined by the switches 20 and respective electronic controls 30.

Figure 7:
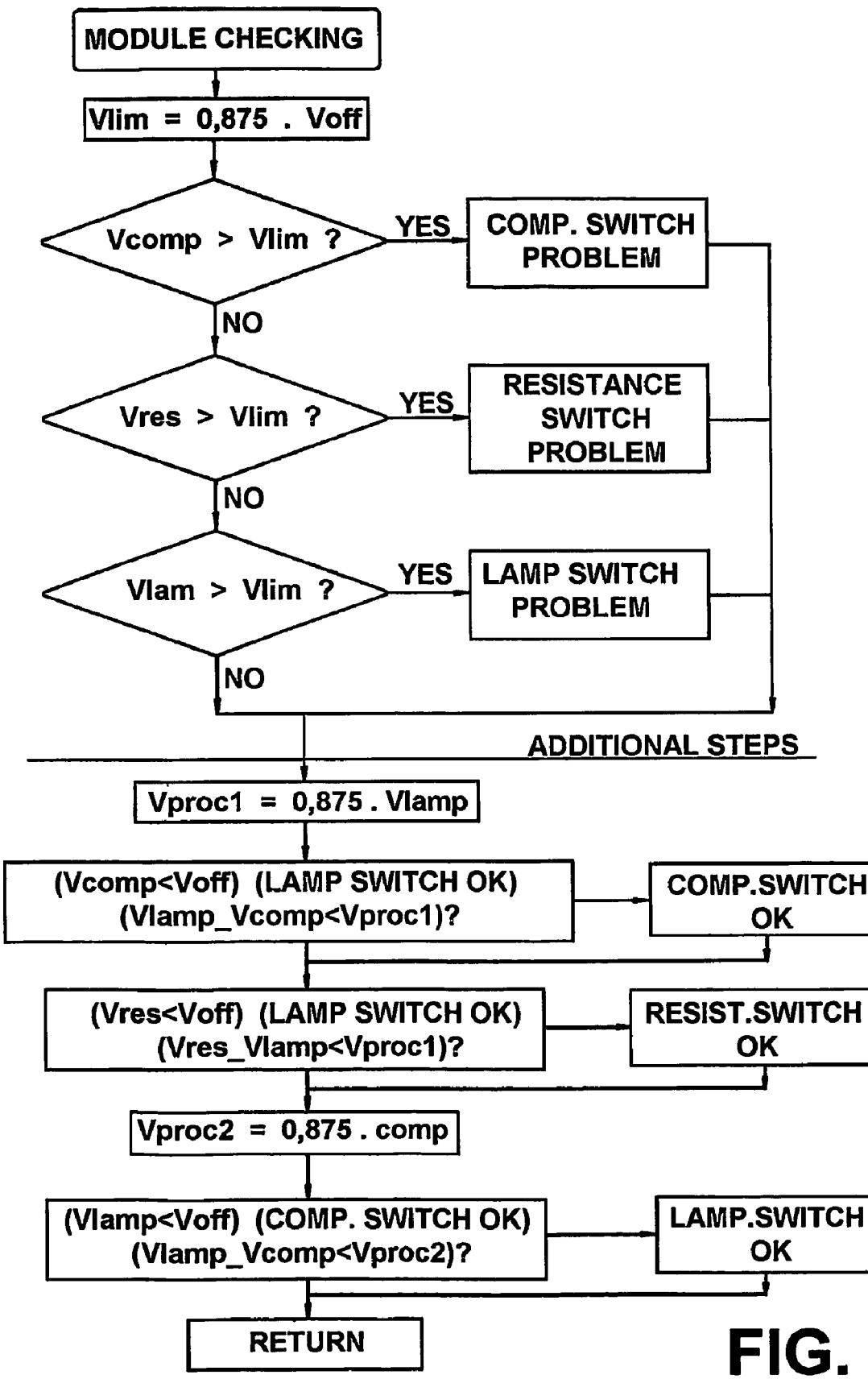
FIG. 7 is a block diagram similar to that of FIG. 6, but illustrating a possible variation for the operational sequence in the step of checking the conditions of the command module.
Figure 8:
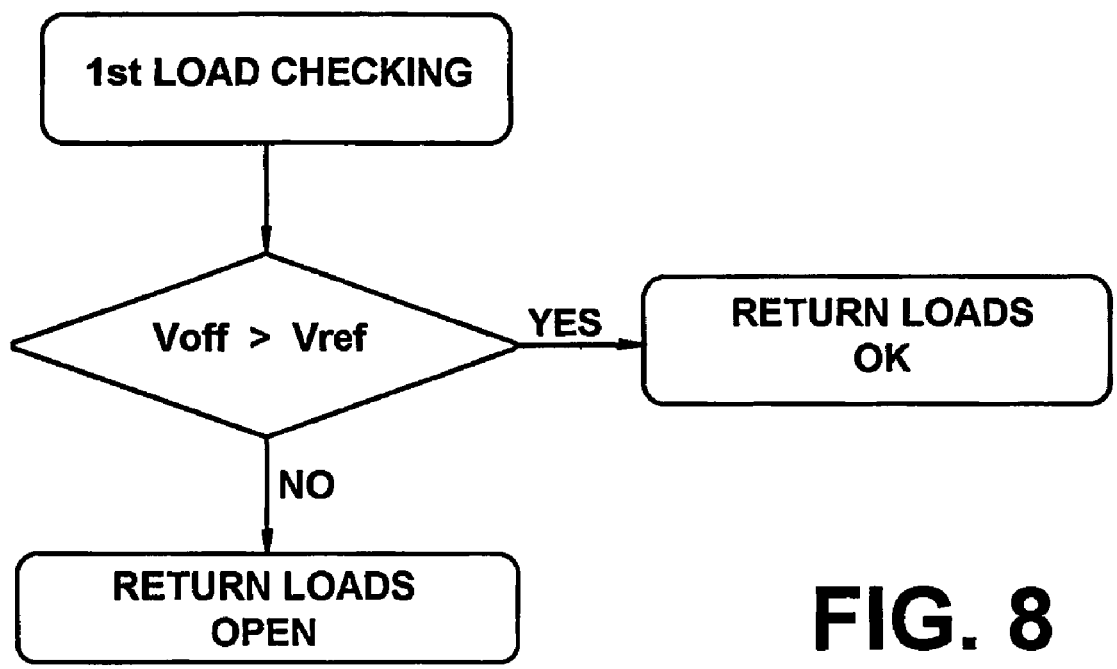
FIGS. 8 and 9 are block diagrams of two possible processing operational sequences of the control unit in the step of checking the operational conditions of the loads of the refrigeration appliance to be submitted to a diagnosis.

In FIG. 7 of the enclosed drawings, there is illustrated another construction for the operational sequence of checking the command module 50. In this construction, the checking of the plate of the command module 50 comprises a first step of defining a limit voltage Vlim lower than the first voltage Voff as a safety value. In a possible way of carrying out the invention, the limit value Vlim is approximately equal to 87.5% of the value of Voff.

Once the limit voltage value Vlim has been defined, the checking comprises the steps of comparing, sequentially, the second voltages Vres, Vlamp, Vcomp in the inlet of the loads 10 having the respective switches 20 in the closed condition with the limit voltage Vlim, and indicating in the interface 80 whether any of the second voltages Vres, Vlamp, Vcomp is greater than the limit voltage Vlim.

In case this condition occurs in any of the loads 10, the processing system concludes that there is a failure in a component of the command module 50 operatively related to the load 10 and whose second voltage is greater than the limit voltage Vlim. In this case, the diagnosis procedure is not interrupted yet, differing from the procedure described in relation to the operational sequence illustrated in FIG. 6.

In the hypothesis of any second voltage Vres, Vlamp, Vcomp being lower than or equal to the limit voltage Vlim, the control unit 70 may produce in the interface 80 the indications that the problem might not be located in the command module 50 and in its components defined by the switches 20 and respective electronic controls.

In the example of FIG. 7, there is provided an additional sequence for checking the command module 50, as illustrated in the lower half of the figure. According to the operational sequence, a first processing step is provided, in which there is defined a first processing voltage Vproc1 lower than the second voltage of a first load 10, which in the present example is represented by the second voltage Vlamp in the inlet of the lamp. In a way of carrying out the invention, the first processing voltage Vproc1 corresponds to about 87.5% of the value of the second voltage Vlamp in the inlet of the first load, i.e., of the lamp. Subsequently, the following steps are processed by the control unit 70:

checking whether the second voltage Vcomp of a second load 10, for example the compressor, is lower than the first voltage Voff, whether the switch 20 of the first load 10 defined by the lamp is operative, and whether the second voltage Vlamp_Vcomp in the inlet of the second load 10, represented by the compressor, and of the first load 10, represented by the lamp, is lower than the first processing voltage Vproc1;

indicating, in the interface 80, by means of the control unit 70, whether the three conditions above have been fulfilled or not fulfilled, the last hypothesis leading to the indication that a problem exists in the switch 20 of the second load 10 represented by the compressor;

checking whether the second voltage Vres of a third load 10 represented by the defrost resistance is lower than the first voltage Voff, whether the switch 20 of the first load 10 represented by the lamp is operative, and whether the second voltage Vres_Vlamp in the inlet of the third and of the first load 10, represented by the defrost resistance and by the lamp, is lower than the first processing voltage Vproc1;

indicating in the interface 80, by means of the control unit 70, whether the three conditions above have been fulfilled or not fulfilled, the last hypothesis leading to the indication that a problem exists in the switch 20 of the third load 10, represented by the defrost resistance;

recording, in the control unit 70, a second processing voltage Vproc2, about 12.5% lower than the second voltage Vcomp of the second load 10, represented by the compressor;

checking whether the second voltage Vlamp of the first load 10 represented by the lamp is lower than the first voltage Voff, whether the switch 20 of the second load 10 represented by the compressor is operative, and whether the second voltage Vlamp_Vcomp in the inlet of the second and of the first load 10, respectively represented by the compressor and the lamp, is lower than the second processing voltage Vproc2;

indicating in the interface 80, by means of the control unit 70, whether the three conditions above have been fulfilled or not fulfilled, the last hypothesis leading to the indication that a problem exists with the switch 20 of the first load 10, represented by the lamp.

This alternative processing illustrated in FIG. 7 allows checking more safely the operation of the command module 50, even considering substantial variations in the voltage supplied by the power system.

Upon completion of the checking operation of the command module 50, jointly with the switches 20 and the electronic controls 30, without finding any failure, the control unit 70 begins processing the sequence of tests of the different loads 10, according to one of two distinct operational sequences that will be automatically defined as a function of the results of a step of comparing the second voltages Vres, Vlamp, Vcomp related to the loads 10 with the switches 20 in the closed condition.

Figure 3:
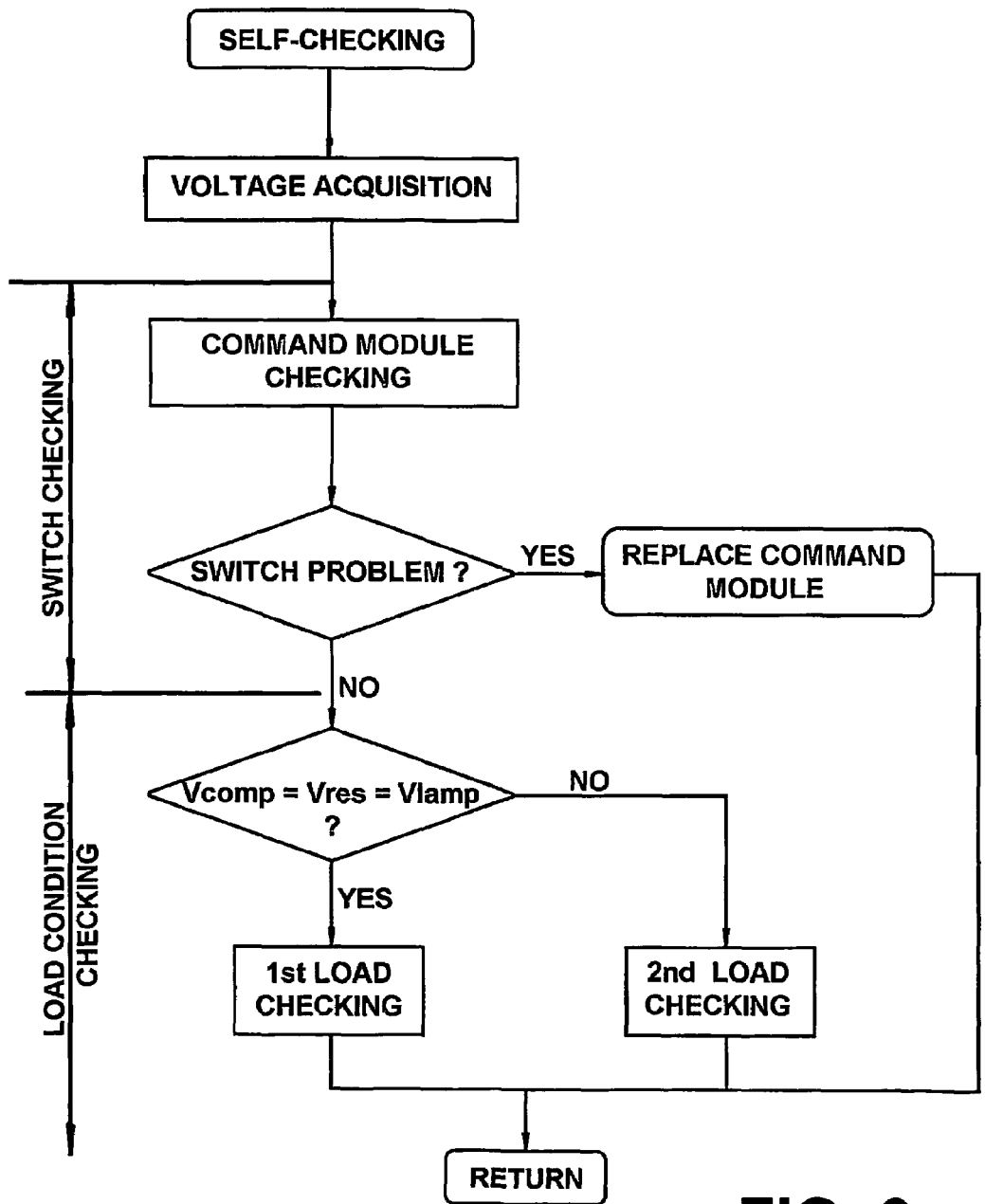
FIG. 3 is a block diagram of the operational sequence defined by the control unit, for obtaining and processing the voltage values during the execution of the diagnosis.

In the hypothesis the second voltages of the different loads 10 are equal or substantially equal, the control unit 70 will initiate the test of the loads 10 by means of a first operational sequence indicated in FIG. 3 and better illustrated in FIG. 7. In this first operational sequence, the control unit 70 verifies whether the first voltage Voff (switches opened) is higher than a certain reference voltage value Vref, which in the example is 1.3V. In case this occurs, all the loads are considered to be in a good state, since the reference voltage Vref illustrates a voltage value above which the first voltage Voff is compulsorily located with a certain margin of safety, in case the loads 10 are in adequate operational conditions.

Thus, in case a first voltage Voff (switches opened) is detected to be higher than the reference voltage Vref, it can be concluded that all the loads are really correctly closed, i.e., in adequate operational conditions.

On the other hand, in case the control unit 70 detects a first voltage Voff that is equal to or lower than the reference value, the interface 80 will be instructed to indicate that all the loads 10 are open. It should be noted herein that the present diagnosis system does not detect short circuits in the loads 10.

Figure 9:
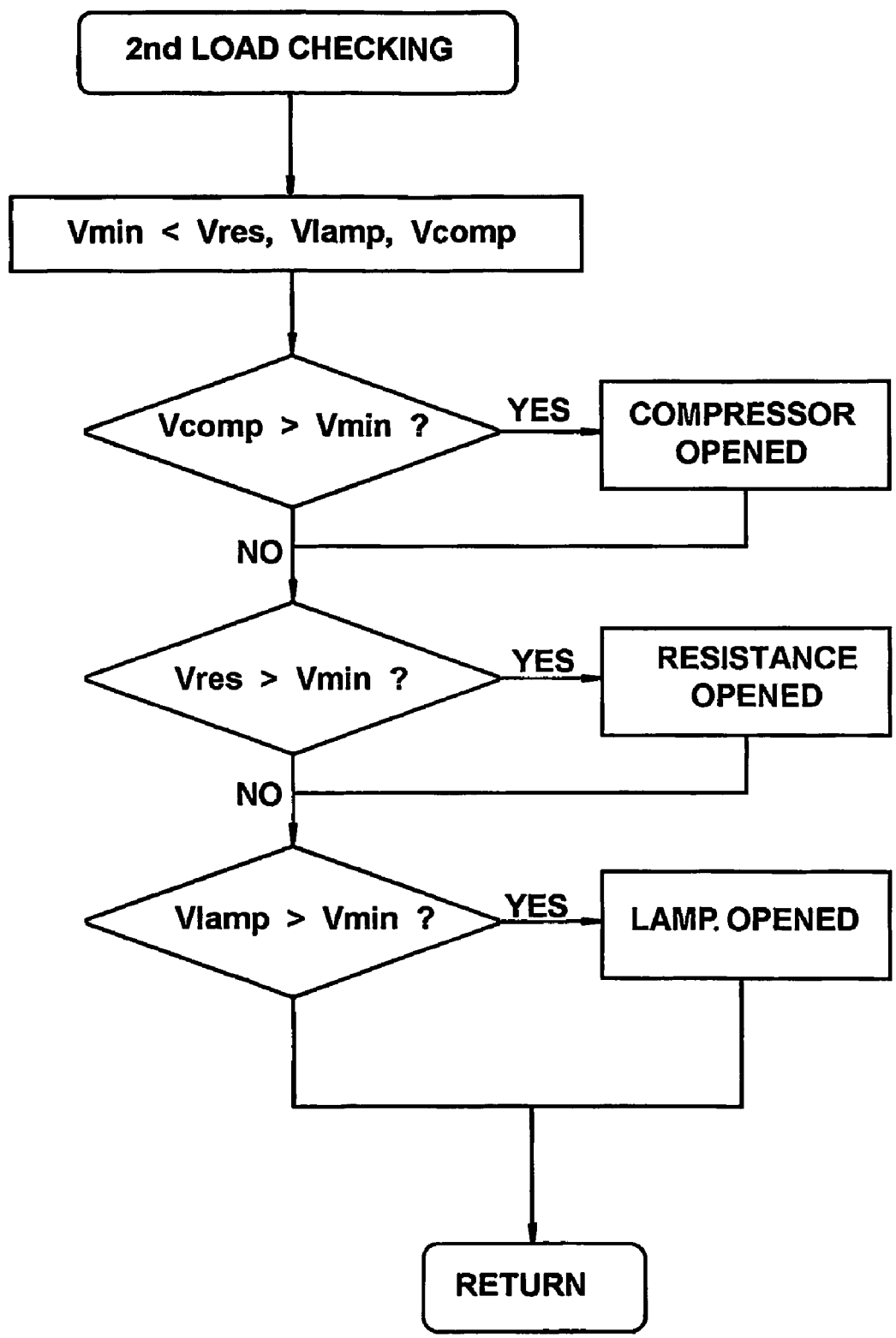

In the hypothesis the second voltages Vres, Vlamp, Vcomp present differences of value, the control unit 70 will initiate the second operational sequence of load testing, as schematically illustrated in FIG. 9, with the purpose of identifying which load is open, and therefore, presenting a defect.

This second operational sequence of load tests comprises several steps, each basically comparing the second voltage Vres, Vlamp, Vcomp of each load 10 (switch 20 closed) with a certain minimum voltage Vmin, which may correspond, for example, to about 75% of the value of the lowest second voltage Vres, Vlamp, Vcomp recorded in the voltage acquisition phase.

Thus, in case any second voltage Vres, Vlamp, Vcomp measured in the inlet of a load 10 presents a value that is equal to or lower than that minimum value Vmin, the control unit will send to the interface 80 an instruction identifying the open condition (failure) of the load. In case a step of checking the operational condition of a load 10 concludes for the acceptance of the load, the control unit 70 will pass to the next step of checking the condition of another load, with no need of indicating in the interface 80 whether this or that load is in acceptable conditions.

Upon completion of the steps of checking the condition of each of the loads 10, the control unit 70 instructs the command module 50 to normally operate the refrigeration appliance.

To carry out a new diagnosis procedure, the technician in charge may press a key in the appliance or disconnect the latter from the power system, awaiting a certain time until the compressor is activated, and then he reconnects the appliance and introduces in the command module 50, in the predetermined time, the specific password to initiate the diagnosis phases by instruction of the control unit 70.

The invention claimed is:

1. A diagnosis system for household electric appliances of the type presenting multiple loads which are energized by switches commanded by respective electronic controls operatively coupled to a command module, which energizes the loads and an interface coupled thereto, comprising:
a voltmeter operatively coupled to an inlet of each load, so as to measure a first voltage in the inlets of all of the loads with the switches opened, and one or more second voltage in corresponding inlets of loads each having a respective switch for the load closed; and
a control unit operatively associated with the command module and with the voltmeter and which is operated according to a sequence of tests that are selectively activated to receive from the voltmeter the values of the first voltage and of each second voltage and to process these values, indicating in an interface the existence of failure in at least one of a plurality of elements defined by the command module, the switches and respective electronic controls thereof, the existence of a failure being indicated in case any second voltage presents a value that is equal to or higher than that of the first voltage.

2. The diagnosis system as set forth in claim 1, wherein the control unit is operated so as to further process, sequentially, the values of a pair of second voltages of two loads with the respective switches of the two loads simultaneously closed, indicating in the interface the existence of failure in at least one of the plurality of elements defined by the command module, the switches and the respective electronic controls thereof, in case any second voltage for one or more of the two loads presents a value that is equal to or higher than a limit voltage which is lower than the first voltage, or in case the pair of second voltages for each of the two loads presents a value that is equal to or higher than a processing voltage which is lower than the second voltage of one of the two loads having activating means in the command module that are not being tested.

3. The diagnosis system as set forth in claim 2, wherein the limit voltage has a value corresponding to about 87.5% of the value of the first voltage.

4. The diagnosis system as set forth in claim 2, wherein the processing voltage has a value corresponding to about 87.5% of the value of the second voltage of the one load having activating means in the command module that are not being tested.

5. The diagnosis system as set forth in claim 2, wherein the control unit returns the command module to normal operation in the household electric appliance, after it has indicated in the interface the existence of failure in the operation of the at least one element defined by the command module, the switches, and the electronic controls.

6. The diagnosis system as set forth in claim 2, wherein the control unit indicates in the interface the absence of failure in the loads, when the second voltages measured by the voltmeter are lower than the first voltage and the latter is higher than a reference voltage corresponding to a voltage value above which values for the first voltage directly indicate a correct operational condition of the loads.

7. The diagnosis system as set forth in claim 6, wherein the control unit compares the first voltage with the reference voltage only after it has compared the second voltages with each other and verified that the compared second voltages are equal or substantially equal.

8. The diagnosis system as set forth in claim 6, wherein the control unit indicates in the interface the existence of failure in one of the loads, when a respective second voltage of the one load is lower than a minimum voltage, which is lower than the lowest second voltage in the inlet of each of the plurality of loads when a respective switch for the load having the lowest second voltage is closed and indicates a correct operational condition of the load.

9. The diagnosis system as set forth in claim 8, wherein the minimum voltage has a value corresponding to about 75% the value of the lowest second voltage.

10. The diagnosis system as set forth in claim 8, wherein the control unit compares each second voltage with the minimum voltage only after comparing said second voltages with each other and verifying that the compared second voltages are not equal.

11. The diagnosis system as set forth in claim 1, wherein the control unit returns the command module to normal operation for the household electric appliance, after it has indicated in the interface the existence of the failure in the operation of the at least one element.

12. The diagnosis system as set forth in claim 1, wherein the control unit indicates in the interface the absence of failure in the loads, when the second voltages measured by the voltmeter are lower than the first voltage and the latter is higher than a reference voltage corresponding to a voltage value above which values for the first voltage directly indicate a correct operational condition of the loads.

13. The diagnosis system as set forth in claim 12, wherein the control unit compares the first voltage with the reference voltage only after it has compared the second voltages with each other and verified that the compared second voltages are equal or substantially equal.

14. The diagnosis system as set forth in claim 12, wherein the control unit indicates in the interface the existence of failure in one of the loads, when a respective second voltage of the one load is lower than a minimum voltage, which is lower than the lowest second voltage in the inlet of each of the plurality of loads when a respective switch for the load having the lowest second voltage is closed and indicates a correct operational condition of the load.

15. The diagnosis system as set forth in claim 14, wherein the minimum voltage has a value corresponding to about 75% of the value of the lowest second voltage.

16. The diagnosis system as set forth in claim 14, wherein the control unit compares each second voltage with the minimum voltage only after comparing said second voltages with each other and verified that the compared second voltages are not equal.

17. The diagnosis system as set forth in claim 1, wherein the voltmeter comprises a signal conditioning circuit connected to the inlet of each load upstream from the respective switch for the load and supplying voltage signals from said inlet of each load to the control unit.

18. The diagnosis system as set forth in claim 17, wherein the voltage signals from the inlet of each load are sent to an AD converter connected to the control unit.

19. The diagnosis system as set forth in claim 1, wherein the control unit interrupts the sequence of tests in case any second voltage presents a value that is equal to or higher than that of the first voltage.

* * * * *